(12) United States Patent
Schneider et al.

(10) Patent No.: US 10,635,533 B2
(45) Date of Patent: Apr. 28, 2020

(54) EFFICIENT COMPUTATION OF PARITY DATA IN STORAGE SYSTEM IMPLEMENTING DATA STRIPING

(71) Applicant: EMC IP Holding Company LLC, Hopkinton, MA (US)

(72) Inventors: Zvi Schneider, Tel Aviv (IL); Amitai Alkalay, Kadima (IL); Assaf Natanzon, Tel Aviv (IL)

(73) Assignee: EMC IP Holding Company LLC, Hopkinton, MA (US)

( * ) Notice: Subject to any disclaimer, the term of this patent is extended or adjusted under 35 U.S.C. 154(b) by 115 days.

(21) Appl. No.: 16/049,185

(22) Filed: Jul. 30, 2018

(65) Prior Publication Data
US 2020/0034231 A1 Jan. 30, 2020

(51) Int. Cl.
*G11C 29/00* (2006.01)
*G06F 11/10* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .............. G06F 11/073; G06F 11/0745; G06F 11/0772; G06F 13/1668; G06F 11/267; G06F 11/1068; G06F 3/0619; G06F 3/064; G06F 3/0688; G06F 3/0689; G11C 29/12; G11C 7/1036; G11C 29/32; G11C 7/1078;
(Continued)

(56) References Cited

U.S. PATENT DOCUMENTS

| 7,444,464 B2 | 10/2008 | Urmston et al. |
| 8,095,726 B1 | 1/2012 | O'Connell et al. |

(Continued)

FOREIGN PATENT DOCUMENTS

WO 2016111954 A1 7/2016

OTHER PUBLICATIONS

EMC Corporation, "Introduction to the EMC XtremIO Storage Array (Ver. 4.0): A Detailed Review," White Paper, Apr. 2015, 65 pages.
(Continued)

*Primary Examiner* — Guerrier Merant
(74) *Attorney, Agent, or Firm* — Ryan, Mason & Lewis, LLP

(57) ABSTRACT

In an information processing system including a set of data storage devices for storing data blocks arranged in respective columns on each data storage device and rows across the set of data storage devices to form at least one data stripe, and a set of parity storage devices for storing parity blocks computed via one or more parity operations based on the data blocks of the at least one data stripe, at least one of the data storage devices includes a processing device configured to: receive from the information processing system an instruction to perform at least a portion of a parity operation; perform the portion of the parity operation; and send a result of the performed portion of the parity operation to the information processing system, wherein the result is useable by the information processing system for performing another portion of the parity operation.

20 Claims, 8 Drawing Sheets

(51) Int. Cl.
*G11C 29/52* (2006.01)
*G06F 3/06* (2006.01)

(52) U.S. Cl.
CPC .......... *G06F 3/0688* (2013.01); *G06F 3/0689* (2013.01); *G11C 29/52* (2013.01)

(58) Field of Classification Search
CPC .............. G11C 29/12015; G11C 29/52; G01R 31/3177; G01R 31/318558; G01R 31/318566; G01R 31/3187; G01R 31/31725; G01R 31/318572; G01R 31/318536; G01R 31/31727; G01R 31/318541; G01R 31/318508; G01R 31/318547; G01R 31/318516; G01R 31/31922; G01R 31/31921; G01R 31/3193; G01R 31/318594
See application file for complete search history.

(56) References Cited

U.S. PATENT DOCUMENTS

| | | | |
|---|---|---|---|
| 8,214,612 | B1 | 7/2012 | Natanzon |
| 9,104,326 | B2 | 8/2015 | Frank et al. |
| 9,208,162 | B1 | 12/2015 | Hallak et al. |
| 9,286,003 | B1 | 3/2016 | Hallak et al. |
| 9,606,870 | B1 | 3/2017 | Meiri et al. |
| 9,716,754 | B2 | 7/2017 | Swift |
| 9,891,994 | B1 | 2/2018 | Schneider et al. |
| 2008/0279462 | A1 | 11/2008 | Celi, Jr. |
| 2009/0132955 | A1 | 5/2009 | Garg et al. |
| 2010/0179941 | A1 | 7/2010 | Agrawal et al. |
| 2013/0325824 | A1 | 12/2013 | Shoens |
| 2014/0181016 | A1 | 6/2014 | Whitehead et al. |
| 2016/0150012 | A1 | 5/2016 | Barszczak et al. |
| 2016/0170987 | A1 | 6/2016 | Kesselman |
| 2016/0202927 | A1 | 7/2016 | Klarakis et al. |
| 2016/0224259 | A1 | 8/2016 | Ahrens et al. |
| 2017/0192857 | A1 | 7/2017 | Meiri et al. |

OTHER PUBLICATIONS

EMC Corporation, "Unstoppable Data Reduction: Always-on, In-Line, Zero-Penalty, Enterprise-Class, Free,"https://store.emc.com/xtremio, Jul. 2014, 2 pages.

EMC Corporation, "Introduction to XtremIO Virtual Copies," White Paper, Mar. 2016, 39 pages.

EMC Corporation, "XtremIO Data Production (XDP): Flash-Specific Data Protection, Provided by XtremIO (Ver. 4.0)," White Paper, Apr. 2015, 25 pages.

Dell EMC, "XtremIO v6.0 Specifications," Specification Sheet, 2017, 4 pages.

Dell EMC, "Dell EMC XtremIO X2: Next-Generation All-Flash Array," Data Sheet, 2017, 5 pages.

EMC Corporation, "High Availability, Data Protection and Data Integrity in the XtremIO Architecture," White Paper, Apr. 2015, 28 pages.

Y. Zhang et al., "End-to-End Integrity for File Systems: A ZFS Case Study," Proceedings of the 8th USENIX Conference on File and Storage Technologies (FAST), Feb. 23-26, 2010, 14 pages.

Dell EMC, "Introduction to Dell EMC XtremIO X2 Storage Array—A Detailed Review," Dell EMC White Paper, Aug. 2017, 46 pages N. Tolia et al., "Opportunistic Use of Content Addressable Storage for Distributed File Systems," Proceedings of the USENIX Annual Technical Conference, Jun. 9-14, 2003, 14 pages.

EMC Corporation, "EMC Recoverpoint Replication of XtremIO: Understanding the Essentials of RecoverPoint Snap-Based Replication for XtremIO," EMC White Paper, Aug. 2015, 31 pages.

Dell EMC, "Introduction to Dell EMC XtremIO X2 Storage Array—A Detailed Review," Dell EMC White Paper, Apr. 2018, 52 pages.

Dell EMC, "Introduction to XtremIO Metadata-Aware Replication," Dell EMC White Paper, Apr. 2018, 18 pages.

| | D0 | D1 | D2 | D3 | D4 | P | $\overline{Q}$ |
|---|---|---|---|---|---|---|---|
| 600 | | | | | | | |
| | DATA | DATA | DATA | DATA | DATA | ROW PARITY | DIAGONAL PARITY AND COLUMN PARITY |
| | DATA | DATA | DATA | DATA | DATA | ROW PARITY | DIAGONAL PARITY AND COLUMN PARITY |
| | DATA | DATA | DATA | DATA | DATA | ROW PARITY | DIAGONAL PARITY AND COLUMN PARITY |
| | DATA | DATA | DATA | DATA | DATA | ROW PARITY | DIAGONAL PARITY AND COLUMN PARITY | k−1 (rows), k = 5

FIG. 7

| (DATA) SSD 1 | (DATA) SSD 2 | (DATA) SSD 3 | ... | (DATA) SSD 33 | (DATA) SSD 34 | P SSD 35 | Q SSD 36 |
|---|---|---|---|---|---|---|---|
| T | T | T | | F | F | $p_1$ | $\bar{q}_1$ |
| F | T | F | | T | T | $p_2$ | $\bar{q}_2$ |
| ... | ... | ... | ... | ... | ... | ... | ... |
| T | F | T | | T | T | $p_{38}$ | $\bar{q}_{38}$ |
| T | T | F | | T | F | $p_{39}$ | $\bar{q}_{39}$ |
| T | T | T | | T | T | $p_{40}$ | $\bar{q}_{40}$ |

700

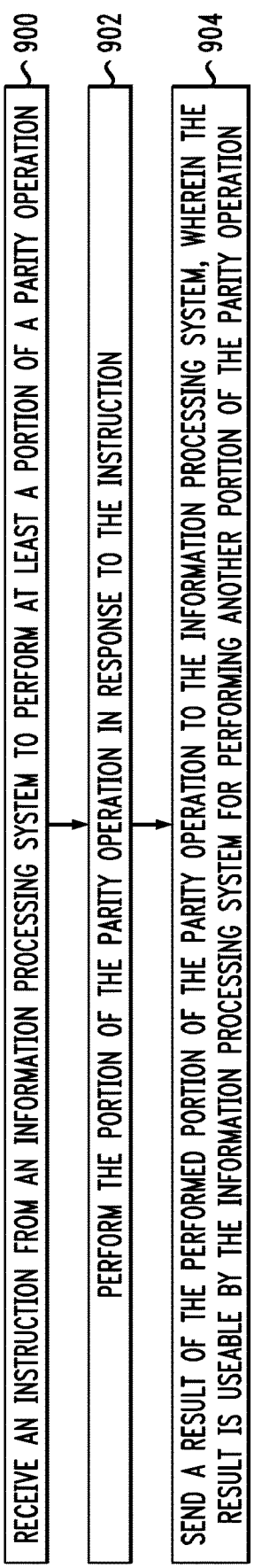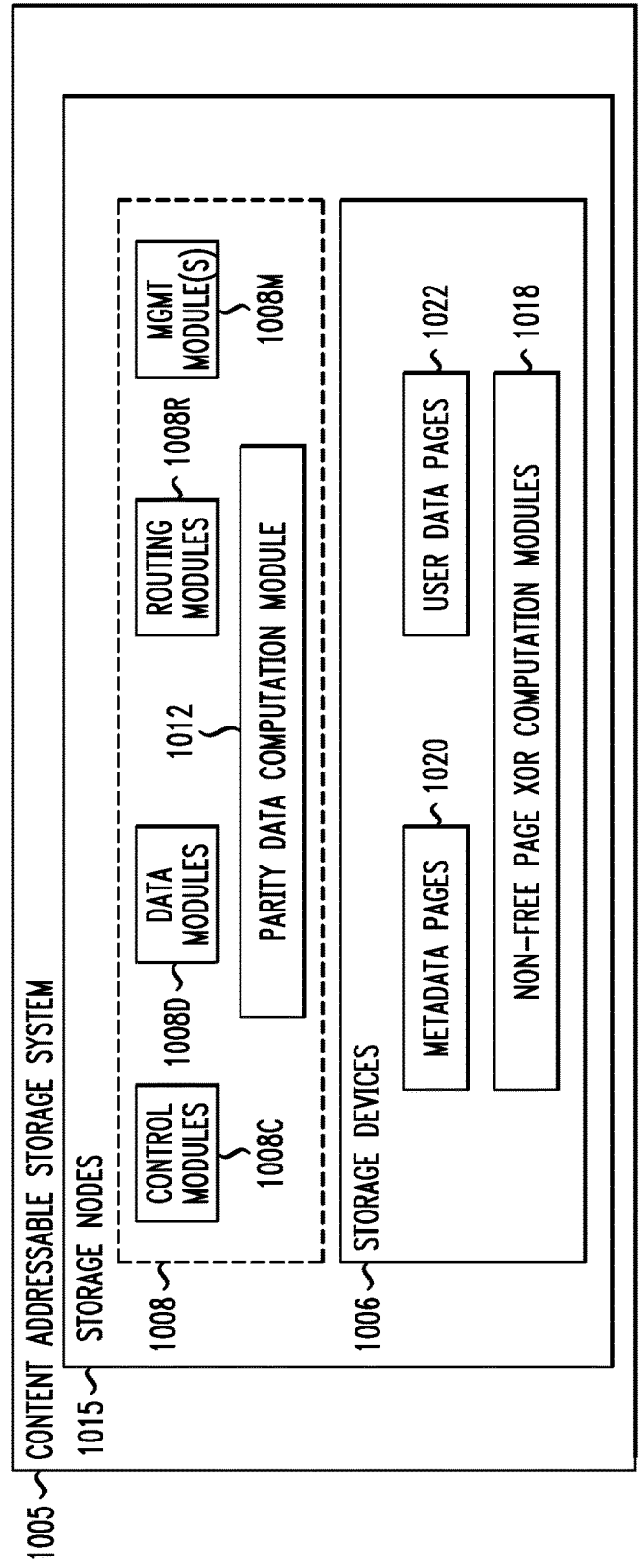

EFFICIENT COMPUTATION OF PARITY DATA IN STORAGE SYSTEM IMPLEMENTING DATA STRIPING

FIELD

The field relates generally to information processing systems, and more particularly to storage in information processing systems.

BACKGROUND

In many information processing systems, storage systems are key elements. Storage systems, such as block based storage systems, are designed to store and retrieve large amounts of data. To store a block of data, a data block address and data block content are provided. The data block address is also used to retrieve the data block content stored at the specified address. Some storage solutions rely on address-based mapping of data, as well as address-based functionality of a storage system's internal algorithms. This is natural, since computing applications typically rely on address-based mapping and identification of data that is stored and retrieved. However, another solution in which data, internally within a storage system, is mapped and managed based on its content instead of its address can provide various substantial advantages. For example, such a content-based storage solution improves storage capacity efficiency since any duplicate block data will only occupy actual capacity of a single instance of that block. As another example, the content-based storage solution can improve performance since duplicate block writes do not need to be executed internally in the storage system. Content-based storage solutions, however, face various challenges.

SUMMARY

Embodiments provide techniques for the efficient computation of parity data in a storage system, overcoming various constraints associated with computation of parity data in storage systems that implement data striping across a plurality of storage devices. Through the use of processing capabilities internal to one or more storage devices to compute parity data, improvements in storage system performance are provided.

For example, in an information processing system implementing data striping, wherein the information processing system comprises a set of data storage devices for storing data blocks arranged in respective columns on each data storage device and rows across the set of data storage devices to form at least one data stripe; and a set of parity storage devices for storing parity blocks computed via one or more parity operations based on the data blocks of the at least one data stripe, at least one of the data storage devices comprises a processing device configured to perform the following steps. An instruction is received at the data storage device from the information processing system to perform at least a portion of a parity operation. The processing device of the data storage device performs the portion of the parity operation in response to the instruction. The data storage device sends a result of the performed portion of the parity operation to the information processing system, wherein the result is useable by the information processing system for performing another portion of the parity operation.

In some embodiments, the portion of the parity operation performed by the processing device of the at least one data storage device comprises performing a column parity operation, wherein the column parity operation comprises performing an XOR operation on at least a portion of the column of data blocks stored in the at least one data storage device to generate column parity data such that the column parity data is the result sent to the information processing system.

In some embodiments, the column parity data is combinable with other forms of parity data storable on at least one of the set of parity storage devices such as diagonal parity data computed for the at least one data stripe.

In some embodiments, the set of data storage devices and the set of parity storage devices are part of a Redundant Array of Independent Disks (RAID) storage system. For example, in one or more embodiments, the RAID storage system implements RAID 6 with the number of data storage devices being k and the number of parity storage devices being n, where n is greater than one.

In some embodiments, the set of data storage devices and the set of parity storage devices comprise solid state drives (SSDs). Further, in one or more embodiments, the processing device associated with the at least one data storage device comprises one or more of a central processing unit and a hardware accelerator internal to the SSD.

These and other illustrative embodiments include, without limitation, apparatus, systems, methods and processor-readable storage media.

BRIEF DESCRIPTION OF THE DRAWINGS

FIG. 7 is a table showing an example of a stripe of a RAID 6 array with free pages and taken pages with which one or more illustrative embodiments can be implemented.

FIG. 9 is a flow diagram illustrating a methodology for using processing capabilities of the storage devices to perform at least a portion of a parity data computation in an illustrative embodiment.

FIG. 10 shows a content addressable storage system having a distributed storage controller configured with functionality for performing parity data computation in an illustrative embodiment.

DETAILED DESCRIPTION

Illustrative embodiments will be described herein with reference to exemplary information processing systems and associated computers, servers, storage devices and other processing devices. It is to be appreciated, however, that these and other embodiments are not restricted to the particular illustrative system and device configurations shown. Accordingly, the term "information processing system" as used herein is intended to be broadly construed, so as to encompass, for example, processing systems comprising cloud computing and storage systems, as well as other types of processing systems comprising various combinations of physical and virtual processing resources. An information processing system may therefore comprise, for example, at least one data center or other cloud-based system that includes one or more clouds hosting multiple tenants that share cloud resources. Numerous different types of enterprise computing and storage systems are also encompassed by the term "information processing system" as that term is broadly used herein.

Figure 1:
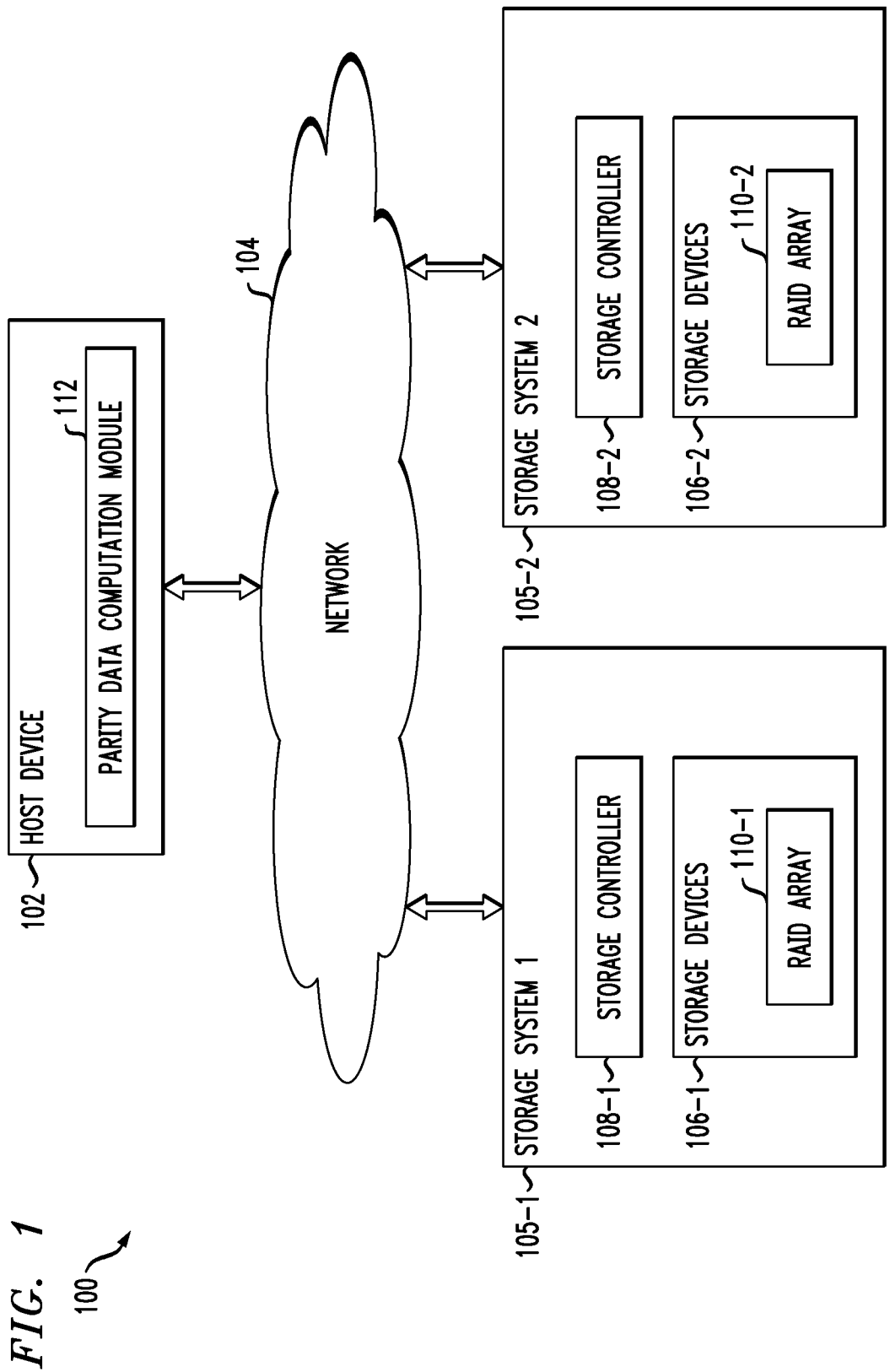
FIG. 1 is a block diagram of one example of an information processing system within which one or more illustrative embodiments are implemented.

FIG. 1 shows an information processing system 100 configured in accordance with an illustrative embodiment. The information processing system 100 comprises a host device 102, which may comprise one of a plurality of host devices of a computer system. The host device 102 communicates over a network 104 with first and second storage systems 105-1 and 105-2, also denoted as Storage System 1 and Storage System 2, respectively. The storage systems 105-1 and 105-2 are collectively referred to herein as storage systems 105. The host device 102 and storage systems 105 may be part of an enterprise computing and storage system, a cloud-based system or another type of system.

The host device 102 and storage systems 105 illustratively comprise respective processing devices of one or more processing platforms. For example, the host device 102 and the storage systems 105 can each comprise one or more processing devices each having a processor and a memory, possibly implementing virtual machines and/or containers, although numerous other configurations are possible.

The host device 102 and the storage systems 105 can additionally or alternatively be part of cloud infrastructure such as an Amazon Web Services (AWS) system. Other examples of cloud-based systems that can be used to provide one or more of host device 102 and storage systems 105 include Google Cloud Platform (GCP) and Microsoft Azure.

The host device 102 is configured to write data to and read data from the storage systems 105. The host device 102 and the storage systems 105 may be implemented on a common processing platform, or on separate processing platforms. A wide variety of other types of host devices can be used in other embodiments.

The host device 102 in some embodiments illustratively provides compute services such as execution of one or more applications on behalf of each of one or more users associated with the host device 102.

The term "user" herein is intended to be broadly construed so as to encompass numerous arrangements of human, hardware, software or firmware entities, as well as combinations of such entities. Compute and/or storage services may be provided for users under a platform-as-a-service (PaaS) model, although it is to be appreciated that numerous other cloud infrastructure arrangements could be used. Also, illustrative embodiments can be implemented outside of the cloud infrastructure context, as in the case of a stand-alone computing and storage system implemented within a given enterprise.

The network 104 is assumed to comprise a portion of a global computer network such as the Internet, although other types of networks can be part of the network 104, including a wide area network (WAN), a local area network (LAN), a satellite network, a telephone or cable network, a cellular network, a wireless network such as a WiFi or WiMAX network, or various portions or combinations of these and other types of networks. The network 104 in some embodiments therefore comprises combinations of multiple different types of networks each comprising processing devices configured to communicate using Internet Protocol (IP) or other communication protocols.

As a more particular example, some embodiments may utilize one or more high-speed local networks in which associated processing devices communicate with one another utilizing Peripheral Component Interconnect express (PCIe) cards of those devices, and networking protocols such as InfiniBand, Gigabit Ethernet or Fibre Channel. Numerous alternative networking arrangements are possible in a given embodiment, as will be appreciated by those skilled in the art.

The storage systems 105 are accessible to the host device over the network 104. The storage system 105-1 comprises a plurality of storage devices 106-1 and an associated storage controller 108-1. Similarly, the storage system 105-2 comprises a plurality of storage devices 106-2 and an associated storage controller 108-2. The storage devices 106-1 and 106-2 are collectively referred to herein as storage devices 106. The storage controllers 108-1 and 108-2 are collectively referred to as storage controllers 108.

The storage devices 106 illustratively comprise solid state drives (SSDs). Such SSDs are implemented using non-volatile memory (NVM) devices such as flash memory. Other types of NVM devices that can be used to implement at least a portion of the storage devices 106 include non-volatile random access memory (NVRAM), phase-change RAM (PC-RAM) and magnetic RAM (MRAM). These and various combinations of multiple different types of NVM devices may also be used.

However, it is to be appreciated that other types of storage devices can be used in other embodiments. For example, a given storage system as the term is broadly used herein can include a combination of different types of storage devices, as in the case of a multi-tier storage system comprising a flash-based fast tier and a disk-based capacity tier. In such an embodiment, each of the fast tier and the capacity tier of the multi-tier storage system comprises a plurality of storage devices with different types of storage devices being used in different ones of the storage tiers. For example, the fast tier may comprise flash drives while the capacity tier comprises hard disk drives. The particular storage devices used in a given storage tier may be varied in other embodiments, and multiple distinct storage device types may be used within a single storage tier. The term "storage device" as used herein is intended to be broadly construed, so as to encompass, for example, flash drives, solid state drives, hard disk drives, hybrid drives or other types of storage devices.

In some embodiments, at least one of the storage systems 105 illustratively comprises a scale-out all-flash content addressable storage array such as an XtremIO™ storage array from Dell EMC of Hopkinton, Mass. Other types of storage arrays, including by way of example VNX® and Symmetrix VMAX® storage arrays also from Dell EMC, can be used to implement one or both of storage systems 105 in other embodiments.

The term "storage system" as used herein is therefore intended to be broadly construed, and should not be viewed as being limited to content addressable storage systems or flash-based storage systems. A given storage system as the term is broadly used herein can comprise, for example, network-attached storage (NAS), storage area networks (SANs), direct-attached storage (DAS) and distributed DAS, as well as combinations of these and other storage types, including software-defined storage.

Other particular types of storage products that can be used in implementing storage systems 105 in illustrative embodiments include all-flash and hybrid flash storage arrays such as Unity™ software-defined storage products such as ScaleIO™ and ViPR®, cloud storage products such as Elastic Cloud Storage (ECS), object-based storage products such as Atmos®, and scale-out NAS clusters comprising Isilon® platform nodes and associated accelerators, all from Dell EMC. Combinations of multiple ones of these and other storage products can also be used in implementing a given storage system in an illustrative embodiment.

In the FIG. 1 embodiment, the storage devices 106 implement one or more Redundant Array of Independent Disks (RAID) arrays, denoted as RAID array 110-1 for storage devices 106-1 of storage system 105-1 and RAID array 110-2 for storage devices 106-2 of storage system 105-2. The RAID arrays 110-1 and 110-2 may collectively form a single RAID array 110, or may represent distinct RAID arrays. The RAID arrays 110 are assumed to store data in stripes across a plurality of SSDs provided by the storage devices 106. The RAID array 110 is an example of what is more generally referred to herein as data striping across a plurality of storage devices in a storage system.

The host device 102 in the FIG. 1 embodiment includes a parity data computation module 112 which provides logic and functionality for computing parity data in a storage system that implements data striping across a plurality of storage devices (e.g., in RAID array 110 on storage devices 106). Parity data computation will be described in further detail below. The host device 102 should also be understood to include additional modules and other components typically found in conventional implementations of computers, servers or other host devices, although such additional modules and other components are omitted from the figure for clarity and simplicity of illustration.

The host device 102 and storage systems 105 in the FIG. 1 embodiment are assumed to be implemented using at least one processing platform each comprising one or more processing devices each having a processor coupled to a memory. Such processing devices can illustratively include particular arrangements of compute, storage and network resources.

The host device 102 and the storage systems 105 may be implemented on respective distinct processing platforms, although numerous other arrangements are possible. For example, in some embodiments at least portions of the host device 102 and one or both of the storage systems 105 are implemented on the same processing platform. The storage systems 105 can therefore be implemented at least in part within at least one processing platform that implements at least a portion of the host device 102.

The term "processing platform" as used herein is intended to be broadly construed so as to encompass, by way of illustration and without limitation, multiple sets of processing devices and associated storage systems that are configured to communicate over one or more networks. For example, distributed implementations of the system 100 are possible, in which certain components of the system reside in one data center in a first geographic location while other components of the system reside in one or more other data centers in one or more other geographic locations that are potentially remote from the first geographic location. Thus, it is possible in some implementations of the system 100 for the host device 102 and storage systems 105 to reside in different data centers. Numerous other distributed implementations of one or both of the host device 102 and the storage systems 105 are possible. Accordingly, the storage systems 105 can also be implemented in a distributed manner across multiple data centers.

Additional examples of processing platforms utilized to implement host devices and/or storage systems in illustrative embodiments will be described in more detail below in conjunction with FIGS. 11 and 12.

It is to be appreciated that these and other features of illustrative embodiments are presented by way of example only, and should not be construed as limiting in any way.

Accordingly, different numbers, types and arrangements of system components such as host device 102, network 104, storage systems 105, storage devices 106, storage controllers 108, and RAID arrays 110 can be used in other embodiments.

It should be understood that the particular sets of modules and other components implemented in the system 100 as illustrated in FIG. 1 are presented by way of example only. In other embodiments, only subsets of these components, or additional or alternative sets of components, may be used, and such components may exhibit alternative functionality and configurations. Additional examples of systems implementing functionality for parity data computation in accordance with data striping will be described below.

Figure 2:
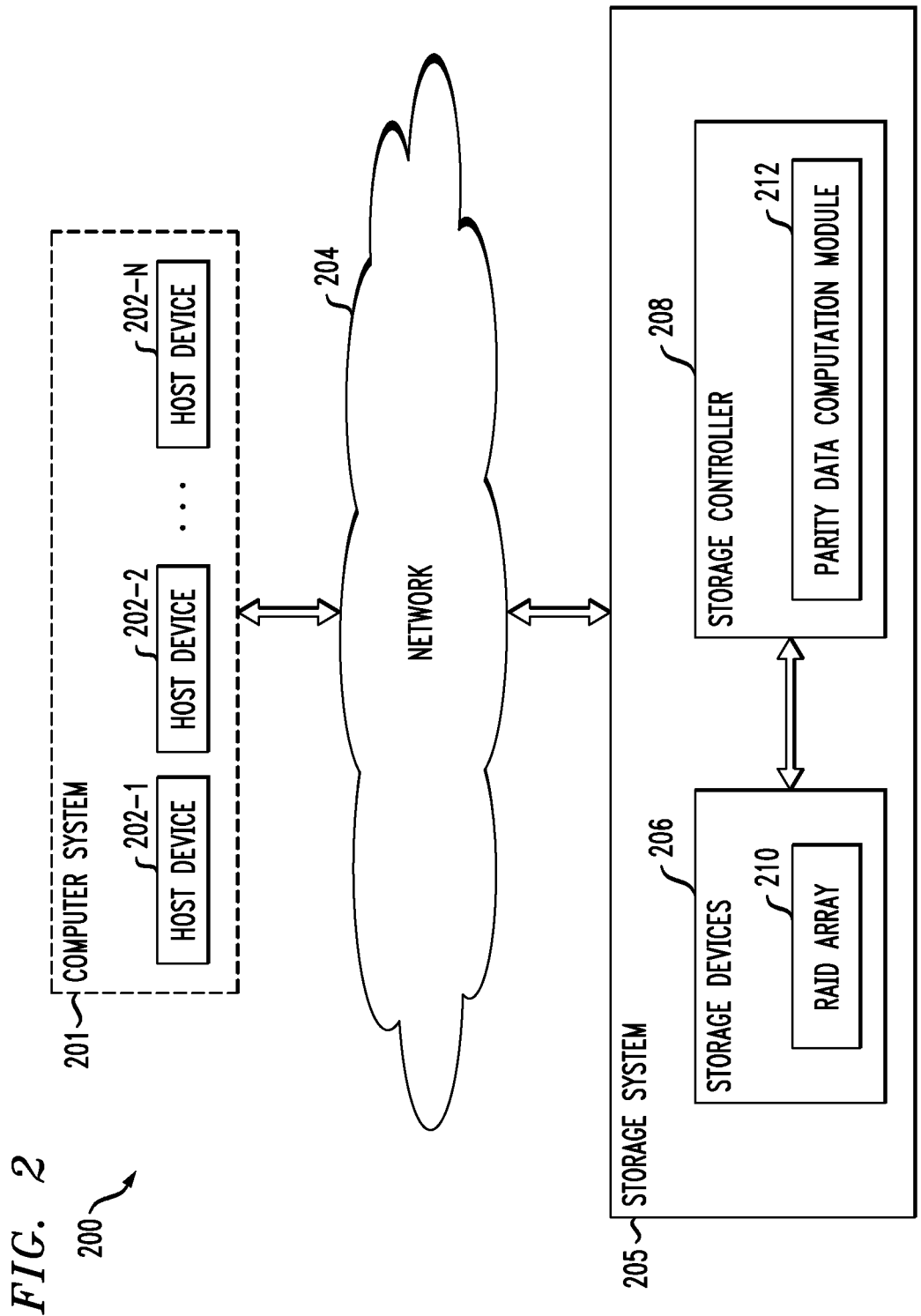
FIG. 2 is a block diagram of another example of an information processing system within which one or more illustrative embodiments are implemented.

FIG. 2 shows an information processing system 200 configured in accordance with another illustrative embodiment. The information processing system 200 comprises a computer system 201 that includes host devices 202-1, 202-2, . . . 202-N collectively referred to as host devices 202. The host devices 202 communicate over a network 204 with a storage system 205. The computer system 201 is assumed to comprise an enterprise computer system, cloud-based computer system or other arrangement of multiple compute nodes associated with respective users. The host devices 202 of the computer system 201 in some embodiments illustratively provide compute services such as execution of one or more applications on behalf of each of one or more users associated with respective ones of the host devices 202.

Similar to the storage systems 105 of system 100, the storage system 205 comprises storage devices 206, storage controller 208 and RAID array 210. However, in this embodiment, the functionality for parity data computation associated with data striping in RAID array 210 is implemented in the storage system 205, rather than in one of the host devices 202. Accordingly, the storage controller 208 in this embodiment comprises parity data computation module 212, which is configured to operate in substantially the same manner as that described above for corresponding module 112 of the host device 102 in the system 100.

Figure 8:
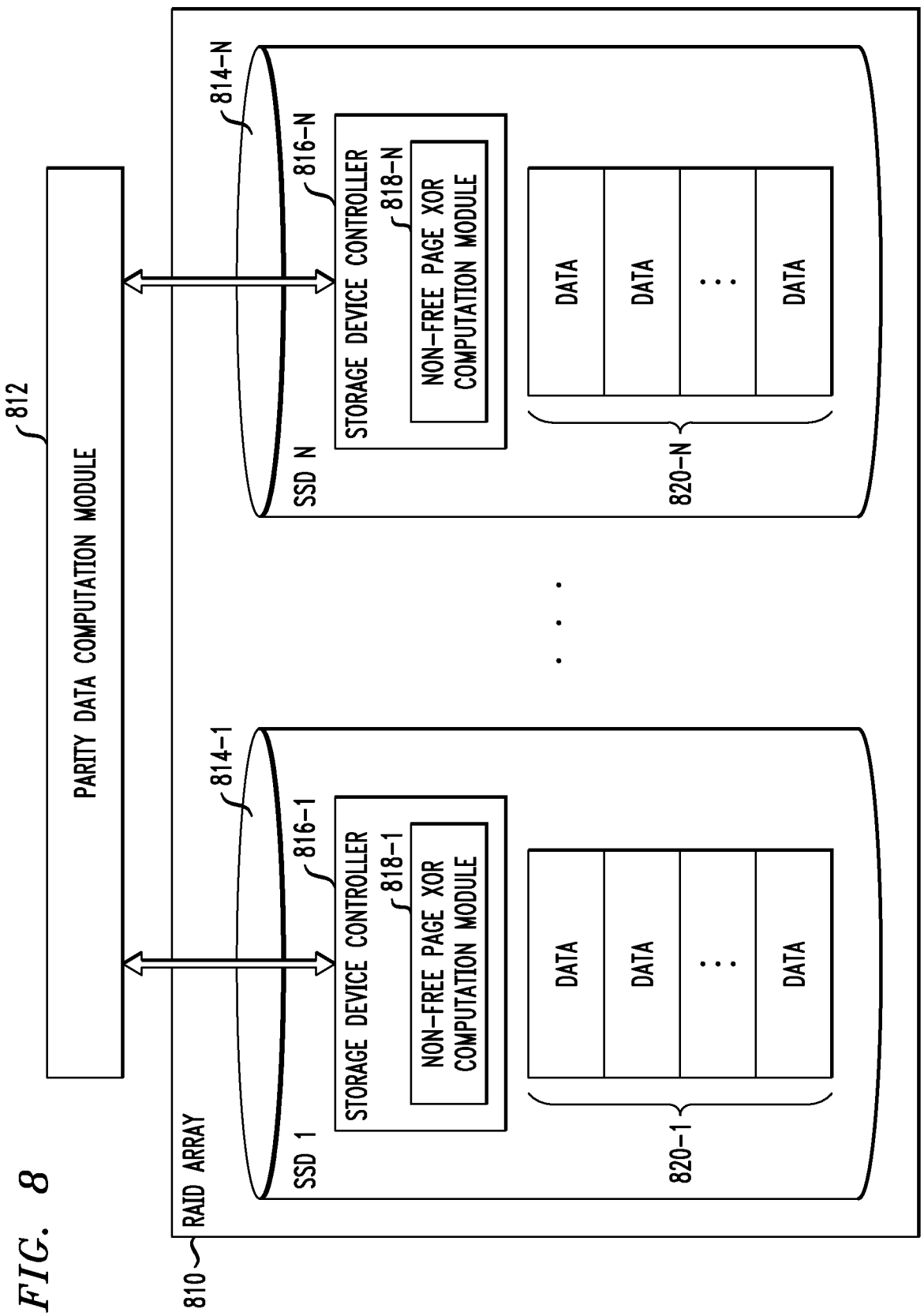
FIG. 8 is a block diagram illustrating a RAID array using processing capabilities of storage devices in the RAID array to perform at least a portion of a parity data computation in an illustrative embodiment.

In some embodiments, functionality for parity data computation associated with data striping can be implemented partially in a host device and partially in the storage system. More particularly, illustrative embodiments as will be described below in the context of FIGS. 8 and 9 provide for utilizing processing capabilities on the storage devices 106 themselves to perform a portion of a parity data computation, results of which are then used for parity data computations on the host device (e.g., module 112) and/or the storage controller (e.g., module 212). Accordingly, illustrative embodiments are not limited to arrangements in which all such functionality is implemented in a host device or a storage system, and therefore encompass various hybrid arrangements in which the functionality is distributed over one or more host devices and one or more storage systems, each comprising one or more processing devices.

Illustrative data striping operations with associated parity data computations in accordance with RAID based techniques will now be described in further detail in the context of the information processing systems 100 and 200. However, it is to be understood that data striping operations with associated parity data computations are more generally applicable to other types of information processing systems. At least some of the parity data computation steps are illustratively performed under the control of the parity data computation module 112 in host device 102 of system 100 or in module 212 in storage controller 208 of system 200.

Data striping in some embodiments is implemented utilizing RAID, such as via RAID arrays 110 on storage systems 105. In such embodiments, the number of data disks in the RAID storage system may comprise a prime number k, and a column of the RAID storage system comprises k−1 blocks. The storage devices of the RAID storage system may be SSDs. The RAID storage system may implement RAID 6 with the number of data disks being k and the number of parity disks being n, where n is greater than one (e.g., where n=2). In some embodiments, the stripe column size is selected as a multiple of a designated block size. The multiple may be a prime number P minus 1. The prime number P may be the same as or different than the prime numbers selected for different ones of the stripes.

In some cases, the prime number selected for a particular stripe may be greater than a number of the plurality of storage devices in the storage system that store data blocks for that stripe. To handle such situations, the parity blocks for the stripe may be computed by assuming or setting a set of virtual storage devices with pages storing designated predetermined values (e.g., zero pages). The particular number of virtual storage devices in the set may be equal to the difference between the prime number selected for that stripe and the number of storage devices in the storage system which store data blocks for that stripe.

The term RAID, as used herein, is an umbrella term for computer data storage schemes that can divide and replicate data among multiple physical disk drives. The terms disks and drives will be used interchangeably henceforth. The physical disks are said to be in a RAID array, which is accessed by an operating system as one single disk. The different schemes or architectures are named by the word RAID followed by a number (e.g., RAID 0, RAID 1, etc.). Each scheme provides a different balance between the goals of increasing data reliability and increasing input/output performance.

The RAID 6 scheme was developed to provide functionality for recovering from multiple disk failure (e.g., similar to RAID 1.3) with high utilization rates (e.g., comparable to RAID 4 and 5) that avoids system bottlenecks. RAID 6 uses an N+2 parity scheme, which allows failure of two disks, where N is the number of disks in the array. RAID 6 defines block-level striping with double distributed parity and provides fault tolerance of two drive failures, so that the array continues to operate with up to two failed drives, irrespective of which two drives fail.

There are various implementations of RAID 6, which may use varying coding schemes. As the term is used herein, RAID 6 is defined as any N+2 coding scheme which tolerates double disk failure, while user data is kept in the clear. This additional requirement assures that user reads are not affected by the RAID scheme under normal system operation. Examples of RAID 6 schemes include those that utilize the Reed Solomon error correction code and those that utilize parity bits, such as those wherein N data disks are supported by two redundancy disks each holding a different parity bit. It should be noted that if all parity bits are on the same two disks, then the performance may be subject to bottlenecks. This can be solved by use of distributed parity stripes over N+2 disks similar to that specified in RAID 5. Examples of coding schemes based on parity calculations of rows and diagonals in a matrix of blocks include Even/Odd and Row Diagonal Parity (RDP). Both of these schemes utilize a first parity disk "P" that holds the parities of rows of blocks as well as a second parity disk "Q" that contains blocks that hold the parity of diagonals of data blocks. In both schemes, it is advantageous to work with a block size that is smaller than the native page size. For example, the native page size may be 8 KB, while the block size is smaller but evenly divisible into 8 KB, e.g., 0.5 KB, 1 KB, 2 KB, 4 KB. In an example where the native page size is 8 KB and the block size is 2 KB, each stripe thus may contain four rows, and thus the four blocks present on each disk form a single native page. However, a stripe can also be defined by multiple rows of blocks distributed across the storage devices of the RAID array. It is assumed that pages are read and written using a single disk operation.

Figures 3, 4:
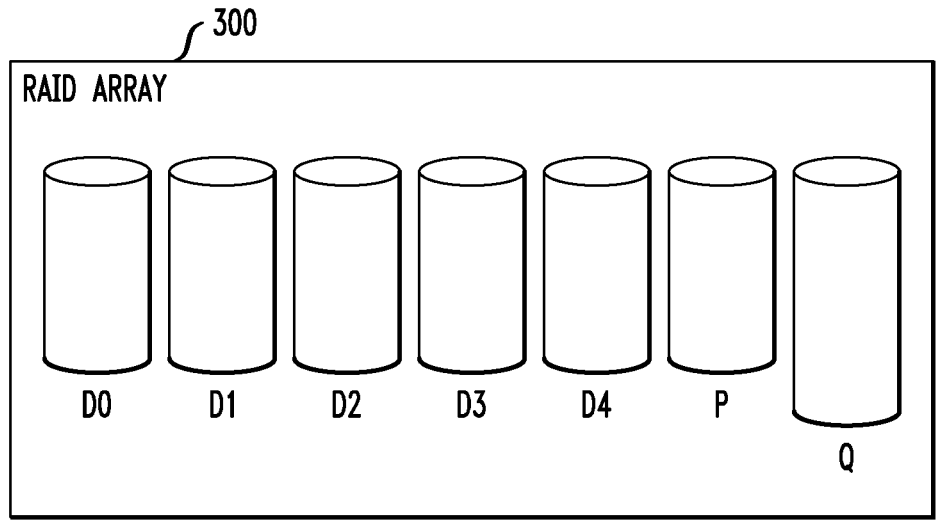
FIG. 3 is a block diagram illustrating an example of a RAID 6 array for implementation in the FIG. 1 system or the FIG. 2 system.
FIG. 4 is a table showing distribution of data blocks in the FIG. 3 RAID 6 array.

FIG. 3 shows a RAID array 300, which in this example includes five data disks denoted D0 through D4. A storage controller (e.g., such as storage controllers 108 or storage controller 208) is configured for writing initial data into the array 300, and for updating existing data in the array 300. The storage controller further provides functionality for recovering data after single or double disk failure.

Each of the disks in the array 300 stores a column of data blocks. The same data block in successive disks forms a row, which is to say the rows cross the disks. The data storage blocks are stored alongside parity data blocks in parity disks denoted P and Q, and the numbers of data blocks in the different columns or disks may be different. Row parity blocks are placed in a row parity column in disk P, and the diagonal parity data is placed in diagonal parity blocks in disk Q. Note that parity data stored in parity disks P and Q is computed in accordance with parity data computation module 112 (FIG. 1 system) or parity data computation module 212 (FIG. 2 system).

In the case of five data columns and four data rows, the number of diagonals is one greater than the number of rows. Thus, the diagonal parity column in disk Q includes one more block than the other columns for disks D0 through D4 and the row parity disk P. This is illustrated in FIG. 3 as Q is "taller" than D0 through D4 and P.

The number of data columns is a prime number, and the number of rows is one less than that prime number (e.g., in the FIG. 3 example the prime number is 5 corresponding to the five data disks D0 through D4). It should be noted that, in practice, the various columns are distributed over the available physical disks to avoid system bottlenecks.

FIG. 4 shows a table 400 illustrating one example distribution of data blocks in the RAID array 300. In this case, there are k data disks, where k=5 is a prime number and there are five data columns corresponding to disks D0 through D4. There are four rows (e.g., k−1). The P column includes the same four rows as the data columns D0 through D4, but the Q column has an extra row.

In one example, each stripe is considered to contain k (where k must be prime) data columns D0 through D4, and two parity columns P and Q. The stripe is composed of a quasi-matrix of blocks, which contains k−1 rows. Column P contains k−1 blocks, each providing the parity of the k data disk blocks in its row. The k by k−1 matrix made up of the blocks in the data columns includes k diagonals each of size k−1. Column Q, in contrast with the rest of the columns, contains k blocks and not k−1. Each of the k blocks in disk Q holds the parity of one of the diagonals. It should be noted that the ordering of blocks within each column may be arbitrary. Furthermore, the extra block in column Q may be placed in a data column which does not contain a data block in the diagonal of which this block is the parity. Also, some of the rows may be blank.

It should be appreciated that there are various other ways to distribute data blocks in an array such as RAID array 300. For example, in some cases it may be desired to provide more than one row parity column, which results in higher capacity overhead but which allows for a faster rebuild after a single disk failure.

Additional details regarding the above-described techniques for storing data in RAID arrays are disclosed in U.S. Pat. No. 9,552,258, entitled "Method and System for Storing Data in RAID Memory Devices," which is incorporated by reference herein.

Figures 5, 6:
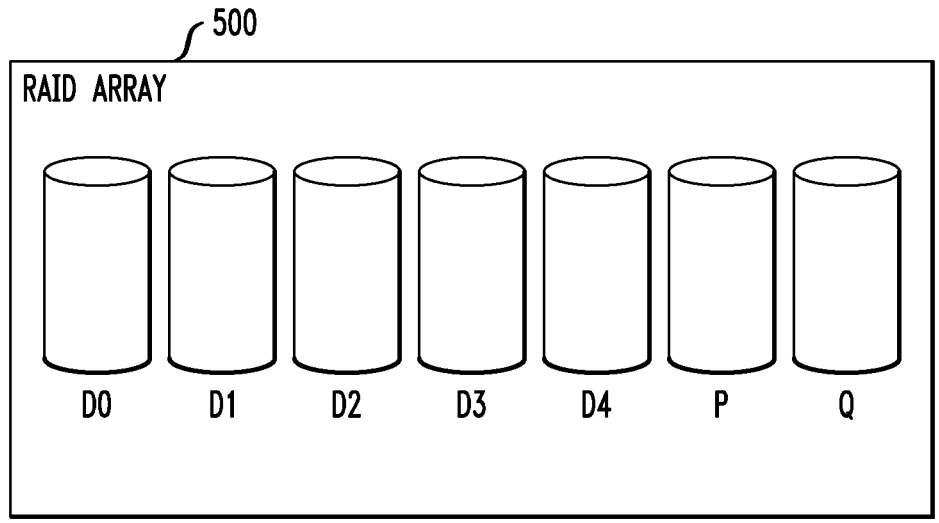
FIG. 5 is a block diagram illustrating another example of a RAID 6 array for implementation in the FIG. 1 system or the FIG. 2 system.
FIG. 6 is a table showing distribution of data blocks in the FIG. 5 RAID 6 array.

FIG. 5 shows a RAID array 500 which, similar to RAID array 300 in FIG. 3, includes five data disks denoted D0 through D4. Similarly, a storage controller (e.g., such as storage controllers 108 or storage controller 208) is configured for writing initial data into the array 500, and for updating existing data in the array 500. The storage controller further provides functionality for recovering data after single or double disk failure.

Similar to array 300, each of the disks in the array 500 stores a column of data blocks. The same data block in successive disks forms a row. Further, the data storage blocks are stored alongside parity data blocks in parity disks denoted P and Q, where row parity blocks are placed in a row parity column in disk P, and the diagonal parity data is placed in parity blocks in disk Q. Note again that parity data stored in parity disks P and Q is computed in accordance with parity data computation module 112 (FIG. 1 system) or parity data computation module 212 (FIG. 2 system).

Recall that in array 300, the diagonal parity column in disk Q includes one more block than the other columns for disks D0 through D4 and the row parity disk P (i.e., in the case of five data columns and four data rows, the number of diagonals is one greater than the number of rows). However, in array 500, Q has the same number of blocks as D0 through D4 and P and therefore is the same size as the other disks, as illustrated in FIG. 5. This is because array 500 utilizes "column parity data" that is computed and combined with diagonal parity data to eliminate the extra block in disk Q. Computation of column parity data will be further explained below.

FIG. 6 shows a table 600 illustrating one example distribution of data blocks in the RAID array 500. The implementation of FIGS. 5 and 6 is referred to as an updated RAID 6 implementation. In this case, as with table 400 for array 300, there are k data disks, where k=5 is a prime number and there are five data columns corresponding to disks D0 through D4. There are four rows (e.g., k−1). The P column includes the same four rows as the data columns D0 through D4, but in this embodiment, unlike table 400, the Q column has the same number of rows as D0 through D4 and P.

In table 600, row parity data and diagonal parity data are computed as described above with respect to table 400. However, parity computation in the embodiment of FIGS. 5 and 6 avoids the extra block in disk Q by adding per column parity to the diagonals. This approach introduces an additional cost of the need to calculate the column parity.

Column parity provides an updated RAID 6 scheme as follows:

Let S be a stripe and mark $S_{i,j}:=$"the block in row i column j".

For every disk j column of the stripe, let $d_j:=\oplus_{i=1}^{p-1} S_{i,j} \forall i \in \{1 \ldots p-1\}$.

Define $p_i:=$"parity of row i" and $q_i:=$"parity of diagonal i". By diagonal i, we refer to the diagonal that is not intersecting with column i (as explained above, non-existent columns are just considered as predefined zeros).

Let $q_p$ be the extra Q block.

Define $\bar{q}_k:=q_k \oplus d_k$ where the symbol $\oplus$ refers to an XOR operation. The XOR operation is a Boolean operation used at the binary level to create RAID parity. This operation is the exclusive disjunction operation also known as exclusive OR (XOR). In the XOR operation (also referred to as XORing, performing XOR, XOR computation, etc.), binary data is passed through logic that embodies the XOR operation and results in a binary result, which is used for redundancy and error correction as described herein. In such case, the result of the XOR operation is referred to as parity data.

Thus, $q_k$ is referred to in table 600 as "diagonal parity" and $d_k$ is referred to as "column parity." As such, $q_k \oplus d_k$ is referred to in table 600 as "diagonal parity and column parity." Further, disk Q is denoted as the $\bar{Q}$ in table 600.

Thus, given P and $\bar{Q}$, the updated RAID 6 implementation described in FIGS. 5 and 6 enables recovery from a double failure. In various embodiments, if a data disk and a Q parity disk fails, recovery in an updated RAID 6 implementation continues as normal.

In certain embodiments, if data disk i≠p and P disk fail, $d_1$ is known for all i≠j, and $d_i$ can be recovered from $\bar{q}_i$ since the diagonal i is not intersecting column i thus $q_i$ is known. In some embodiments, XOR'ing out the $d_j$ from $\bar{Q}$ bring us to the known recovery formula. In certain embodiments, if i=p then Q is known since all $d_j$ are, and each block may be recovered from the diagonal.

In some embodiments, if two data disks fail (disk i and disk j) where neither failed disk is the parity disk P, the updated RAID 6 implementation enables recovery of the blocks using two steps. In one or more embodiments, a first step includes partially recovering each block.

$\hat{S}_{k,i} = \hat{S}_{k,i} \oplus \{\text{either } d_i \text{ or } d_j\}$ $\hat{S}_{k,j} = \hat{S}_{k,j} \oplus \{\text{either } d_i \text{ or } d_j\}$ In one or more embodiments, a second step includes XOR'ing out $d_i$ and $d_j$ to get the data block $S_{k,i}$ and $S_{k,j}$. Since p−1 is even, r and p−1−r are even\odd together, if r is even then an XOR on all blocks of the column i eliminates $d_j$ and $d_i$ and thus we will get $d_i$ and in the same way we can get $d_j$, and thus recover the data. If r is odd, than we get $\oplus_{i=1}^{r} S_{k,j} \oplus_{i=r+1}^{p-1-r} r S_{k,j} \oplus d_j \oplus d_i = d_i$ thus we get $d_i$ and $d_j$ and we may continue recovery. In some embodiments, the case of i=p is just a special case with r=0.

In one or more embodiments, an updated RAID 6 implementation such as that depicted in FIGS. 5 and 6 provides many advantages. For example, a parity disk failure causes, at most, reading 2*P+1 blocks for double-degraded read. Still further, upon write of a single block, at most three parities are be updated (row parity, diagonal parity, and the diagonal XOR'd with the column parity).

Note again that, in some embodiments, parity data stored in parity disks P and Q, including column parity data and the combined diagonal parity and column parity data, is computed in accordance with parity data computation module 112 (FIG. 1 system) or parity data computation module 212 (FIG. 2 system).

Additional details regarding the above-described techniques for storing data in RAID arrays are disclosed in U.S. Pat. No. 9,891,994, entitled "Updated RAID 6 Implementation," which is incorporated by reference herein.

FIG. 7 shows a table 700 illustrating another example data striping distribution with column parity data combined with diagonal parity data as explained above in the context of FIG. 6. In table 700, a stripe S is depicted with prime equal to 41 and 34 data disks SSD 1 through SSD 34. Note that it is assumed that the disks are SSDs. Further, SSD 35 is the row parity disk (disk P above) and SSD 36 is the combined diagonal party and column parity disk (disk $\overline{Q}$ above). Note that each block in the data disks is labeled either "T" for taken space (not available since the space contains data) or "F" for free space (available space since the space does not contain data).

One approach for calculating the column parity $d_j$ (column parity data) is: reading the column from the drive and performing the XOR operations with the diagonal parity data, as explained above, in the host device (e.g., module 112 in FIG. 1) or the storage controller (e.g., module 212 in FIG. 2); adding new pages instead of the old pages; and keeping all the rest of the data pages as they are. This introduces significant read amplification in case the stripe is not empty, as well as CPU consumption for the parity calculations (XOR operations).

For example, assume a page size is 8 KB, and a stripe has 40 rows and 34 data columns as in table 700, and assume the stripe is fifty percent full (50% of the blocks are non-free or taken (T) and 50% are free (F)). Then, there are about 680 pages free (pages that can be overwritten). If they are well distributed across the SSDs, this means there are 20 free pages in each column. For each column, the entire 20 (i.e., 40 minus 20) pages have to be read to recalculate the column (for the stripe, 680 pages in total need to be read), resulting in an additional read operation for every page to update, as well as additional XOR operations of every column. It is also realized that the read amplification gets worse as the stripe is fuller.

An alternative to reading the entire column from the drive is to save the column data which is optimal in terms of bandwidth and CPU consumption but is very wasteful in terms of SSD capacity.

Illustrative embodiments overcome the above and other drawbacks associated with column parity data computations by utilizing processing capabilities of the storage devices (e.g., SSDs) themselves to perform at least a portion of the column parity data computations. For example, SSDs are flash drives that are equipped with processing capabilities such as, for example, an internal central processing unit (CPU) and/or a hardware accelerator unit. One or more such processing capabilities are referred to herein as "a processing device" of the SSD. As will be explained in illustrative embodiments, such processing capabilities of the SSDs are used to perform operations over data in the drives without involving the host device (e.g., 102 in FIG. 1) or storage controllers (e.g., 108 in FIG. 1 or 208 in FIG. 2). The results of the operations performed by the internal processing capabilities of the SSDs are made available to the host device or storage controllers to perform further operations.

More particularly, optimization of the column calculations leverages SSD processing capabilities which, in turn, optimizes both the bandwidth to the drives, as well as saving the CPU of the host device or storage controller needed for calculating the column parity.

For each column (i.e., a column of blocks resides on a specific drive), a command (instruction) is sent from a parity data computation module (112 in host device 108 or module 212 in storage controller 208) to the given drive to calculate the XOR result of all non-free pages in the column using internal CPU and/or hardware acceleration engines of the given drive. The result of the XOR operation is read from the given drive by the parity data computation module (112 or 212). Then, by combining the results read from the given drive with the new data to be written to the free space, the column XOR operation is completed. This optimization is illustrated in FIG. 8.

FIG. 8 is a block diagram illustrating a RAID array using processing capabilities of storage devices in the RAID array to perform at least a portion of a parity data computation in an illustrative embodiment.

As shown in FIG. 8, a RAID array 810 includes a plurality of storage devices 814-1 through 814-N, e.g., SSD 1 through SSD N. Referring back to the example in FIG. 7, N is 34 corresponding to the 34 data drives represented in table 700. Each SSD 814 includes a storage device controller 816 (e.g., 816-1 through 816-N) which implements a non-free page XOR computation module 818 (e.g., 818-1 through 818-N). Storage device controller 816 represents at least a portion of the processing capabilities of the SSD (e.g., internal CPU and/or one or more hardware accelerators). Column data 820 (e.g., 820-1 through 820-N) is also depicted for each SSD 814. Column data 820 represents a column of data blocks for a given SSD 814, similar to the column of data blocks (marked T for non-free or taken and F for free) for each data drive represented in table 700.

Also shown in FIG. 8 is parity data computation module 812. Module 812 represents parity data computation module 112 in host device 108 or parity data computation module 212 in storage controller 208.

To calculate column parity data $d_1$ (as defined above in the description of FIGS. 5 and 6) as an example, parity data computation module 812 sends a command to SSD 1 (814-1) instructing module 818-1 of storage device controller 816-1 to XOR all pages of the stripe that are taken (T). Parity data computation module 812 reads the result of the XOR operation performed by module 818-1 (i.e., SSD 1 sends the result to module 812) and then performs an XOR operation on the read result with the new pages to be written to disk free space which yields the new value of $d_1$. Then, module 812 performs an XOR of $d_1$ and the diagonal parity $q_1$ to obtain $\overline{q}_1$ ("diagonal parity and column parity"). The same operations are performed on each of the other SSDs 814 and between module 812 and each of the other SSDs 814 to obtain a data striping distribution as illustrated in FIG. 6 or 7.

Going back to the example in FIG. 7 described above where a page size is 8 KB, and a stripe has 40 rows and 34 data columns, and the stripe is 50% full such that there are about 680 pages free (can be overwritten), module 812 reads the calculated XOR result from the drives for each column (one read instead of 20 in the example), i.e., 34 pages to read for the entire stripe, and only needs to perform an XOR operation with the new data, introducing also about 50% savings in XOR computation overhead for the host device 102 or storage controller 208 (depending on where module 812 is implemented). Furthermore, in accordance with the FIG. 8 embodiment, as the stripe has less free pages, even more efficiency in CPU is realized for column parity computation.

FIG. 9 is a flow diagram illustrating a methodology for using processing capabilities of the storage devices to perform at least a portion of a parity data computation in an illustrative embodiment.

For example, in an information processing system implementing data striping, wherein the information processing system comprises a set of data storage devices (e.g., data SSDs) for storing data blocks arranged in respective columns on each data storage device and rows across the set of data storage devices to form at least one data stripe; and a set of parity storage devices (e.g., parity SSDs) for storing parity blocks computed via one or more parity operations based on the data blocks of the at least one data stripe, at least one of the data storage devices comprising a processing device (e.g., CPU and/or hardware accelerator) is configured to perform:

Step 900: receive an instruction from the information processing system to perform at least a portion of a parity operation;

Step 902: perform the portion of the parity operation in response to the instruction; and Step 904: send a result of the performed portion of the parity operation to the information processing system, wherein the result is useable by the information processing system for performing another portion of the parity operation.

More particularly, the FIG. 9 methodology illustrates steps performed by each of SSDs 814 in FIG. 8.

It is to be understood that for any methodologies described herein, e.g., data striping with associated parity data computation, the ordering of the process steps may be varied in other embodiments, or certain steps may be performed at least in part concurrently with one another rather than serially. Also, one or more of the process steps may be repeated periodically, or multiple instances of the process can be performed in parallel with one another in order to implement a plurality of different processes for different storage systems or for different RAID arrays or other data striping schemes on a particular storage system or systems.

Functionality such as that described herein can be implemented at least in part in the form of one or more software programs stored in memory and executed by a processor of a processing device such as a computer or server. As will be described below, a memory or other storage device having executable program code of one or more software programs embodied therein is an example of what is more generally referred to herein as a "processor-readable storage medium."

For example, a host device such as host device 102 or a storage controller such as storage controller 208 that is configured to control performance of one or more steps described herein can be implemented as part of what is more generally referred to herein as a processing platform comprising one or more processing devices each comprising a processor coupled to a memory. Such processing devices are to be distinguished from processing devices referred to herein with respect to the processing capabilities of the SSDs. In the case of a host device or storage controller, a given such processing device may correspond to one or more virtual machines or other types of virtualization infrastructure such as Docker containers or Linux containers (LXCs). The host device 102 of system 100 or the storage controller 208 of system 200, as well as other system components, may be implemented at least in part using processing devices of such processing platforms. For example, in a distributed implementation of the storage controller 208, respective distributed modules of such a storage controller can be implemented in respective containers running on respective ones of the processing devices of a processing platform.

In some embodiments, the storage system comprises an XtremIO™ storage array or other type of content addressable storage system suitably modified to incorporate functionality for determining compression block size and selecting prime numbers and associated numbers of sub-stripes for efficient packing of compressed data as disclosed herein.

An illustrative embodiment of such a content addressable storage system will now be described with reference to FIG. 10. In this embodiment, a content addressable storage system 1005 comprises a plurality of storage devices 1006 and an associated storage controller 1008. The content addressable storage system 1005 may be viewed as a particular implementation of the storage system 205, and accordingly is assumed to be coupled to host devices 202 of computer system 201 via network 204 within information processing system 200.

The storage controller 1008 in the present embodiment is configured to implement functionality for data striping including parity data computations of the type previously described in conjunction with FIGS. 1 through 9.

The storage controller 1008 includes module 1012, which is configured to operate in a manner similar to that described above for respective corresponding modules 112, 212, and 812.

The content addressable storage system 1005 in the FIG. 10 embodiment is implemented as at least a portion of a clustered storage system and includes a plurality of storage nodes 1015 each comprising a corresponding subset of the storage devices 1006. Other clustered storage system arrangements comprising multiple storage nodes can be used in other embodiments. A given clustered storage system may include not only storage nodes 1015 but also additional storage nodes coupled via a storage network. Alternatively, such additional storage nodes may be part of another clustered storage system of the system 200. Each of the storage nodes 1015 of the storage system 1005 is assumed to be implemented using at least one processing device comprising a processor coupled to a memory.

The storage controller 1008 of the content addressable storage system 1005 is implemented in a distributed manner so as to comprise a plurality of distributed storage controller components implemented on respective ones of the storage nodes 1015. The storage controller 1008 is therefore an example of what is more generally referred to herein as a "distributed storage controller." In subsequent description herein, the storage controller 1008 may be more particularly referred to as a distributed storage controller.

Each of the storage nodes 1015 in this embodiment further comprises a set of processing modules configured to communicate over one or more networks with corresponding sets of processing modules on other ones of the storage nodes 1015. The sets of processing modules of the storage nodes 1015 collectively comprise at least a portion of the distributed storage controller 1008 of the content addressable storage system 1005.

The modules of the distributed storage controller 1008 in the present embodiment more particularly comprise different sets of processing modules implemented on each of the storage nodes 1015. The set of processing modules of each of the storage nodes 1015 comprises at least a control module 1008C, a data module 1008D and a routing module 1008R. The distributed storage controller 1008 further comprises one or more management ("MGMT") modules 1008M. For example, only a single one of the storage nodes 1015 may include a management module 1008M. It is also possible that management modules 1008M may be implemented on each of at least a subset of the storage nodes 1015.

Each of the storage nodes 1015 of the storage system 1005 therefore comprises a set of processing modules configured to communicate over one or more networks with corresponding sets of processing modules on other ones of the storage nodes. A given such set of processing modules implemented on a particular storage node illustratively includes at least one control module 1008C, at least one data module 1008D and at least one routing module 1008R, and possibly a management module 1008M. These sets of processing modules of the storage nodes collectively comprise at least a portion of the distributed storage controller 1008.

Communication links may be established between the various processing modules of the distributed storage controller 1008 using well-known communication protocols such as IP, Transmission Control Protocol (TCP), and remote direct memory access (RDMA). For example, respective sets of IP links used in data transfer and corresponding messaging could be associated with respective different ones of the routing modules 1008R.

Although shown as a separate module of the distributed storage controller 1008, the module 1012 in the present embodiment is assumed to be distributed at least in part over at least a subset of the other modules 1008C, 1008D, 1008R and 1008M of the storage controller 1008. Accordingly, at least portions of the functionality of the module 1012 may be implemented in one or more of the other modules of the storage controller 1008. In other embodiments, the module 812 may be implemented as stand-alone module of the storage controller 1008.

The storage devices 1006 are configured to store metadata pages 1020 and user data pages 1022 and may also store additional information not explicitly shown such as checkpoints and write journals. The metadata pages 1020 and the user data pages 1022 are illustratively stored in respective designated metadata and user data areas of the storage devices 1006. Accordingly, metadata pages 1020 and user data pages 1022 may be viewed as corresponding to respective designated metadata and user data areas of the storage devices 1006.

A given "page" as the term is broadly used herein should not be viewed as being limited to any particular range of fixed sizes. In some embodiments, a page size of 8 kilobytes (KB) is used, but this is by way of example only and can be varied in other embodiments. For example, page sizes of 4 KB, 16 KB or other values can be used. Accordingly, illustrative embodiments can utilize any of a wide variety of alternative paging arrangements for organizing the metadata pages 1020 and the user data pages 1022.

The user data pages 1022 are part of a plurality of logical units (LUNs) configured to store files, blocks, objects or other arrangements of data, each also generally referred to herein as a "data item," on behalf of users associated with host devices 202. Each such LUN may comprise particular ones of the above-noted pages of the user data area. The user data stored in the user data pages 1022 can include any type of user data that may be utilized in the system 200. The term "user data" herein is therefore also intended to be broadly construed.

Also shown as part of storage devices 1006 are non-free page XOR computation modules 1018 which correspond to module 818 in FIG. 8. Recall that in one or more embodiments each storage device 1006 has a module 1018 for performing at least a portion of the operations associated with column parity data computation as described herein. Modules 1018 are operatively coupled with module 1012 to collectively perform column parity computations for a given RAID array formed by storage devices 1006.

The content addressable storage system 1005 in the embodiment of FIG. 10 is configured to generate hash metadata providing a mapping between content-based digests of respective ones of the user data pages 1022 and corresponding physical locations of those pages in the user data area. Content-based digests generated using hash functions are also referred to herein as "hash digests." The hash metadata generated by the content addressable storage system 805 is illustratively stored as metadata pages 1020 in the metadata area. The generation and storage of the hash metadata is assumed to be performed under the control of the storage controller 1008.

Each of the metadata pages 1020 characterizes a plurality of the user data pages 1022. For example, a given set of user data pages representing a portion of the user data pages 1022 illustratively comprises a plurality of user data pages denoted User Data Page 1, User Data Page 2, . . . User Data Page n. It should be noted that usage of the variable n in this user data page context is unrelated to its usage elsewhere herein.

Each of the user data pages 1022 in this example is characterized by a LUN identifier, an offset and a content-based signature. The content-based signature is generated as a hash function of content of the corresponding user data page. Illustrative hash functions that may be used to generate the content-based signature include the above-noted SHA1 hash function, or other secure hashing algorithms known to those skilled in the art. The content-based signature is utilized to determine the location of the corresponding user data page within the user data area of the storage devices 1006.

Each of the metadata pages 1020 in the present embodiment is assumed to have a signature that is not content-based. For example, the metadata page signatures may be generated using hash functions or other signature generation algorithms that do not utilize content of the metadata pages as input to the signature generation algorithm. Also, each of the metadata pages is assumed to characterize a different set of the user data pages.

A given set of metadata pages representing a portion of the metadata pages 1020 in an illustrative embodiment comprises metadata pages denoted Metadata Page 1, Metadata Page 2, . . . Metadata Page m, having respective signatures denoted Signature 1, Signature 2, . . . Signature m. Each such metadata page characterizes a different set of n user data pages. For example, the characterizing information in each metadata page can include the LUN identifiers, offsets and content-based signatures for each of the n user data pages that are characterized by that metadata page. It is to be appreciated, however, that the user data and metadata page configurations described above are examples only, and numerous alternative user data and metadata page configurations can be used in other embodiments.

Ownership of a user data logical address space within the content addressable storage system 1005 is illustratively distributed among the control modules 1008C.

The functionality provided by module 1012 in this embodiment is assumed to be distributed across multiple distributed processing modules, including at least a subset of the processing modules 1008C, 1008D, 1008R and 1008M of the distributed storage controller 1008.

For example, the management module 1008M of the storage controller 1008 may include logic that engages corresponding logic instances in all of the control modules 1008C and routing modules 1008R in order to implement processes for parity data computation.

In some embodiments, the content addressable storage system 1005 comprises an XtremIO™ storage array suitably modified to incorporate techniques for parity data computation as disclosed herein.

In arrangements of this type, the control modules 1008C, data modules 1008D and routing modules 1008R of the distributed storage controller 1008 illustratively comprise respective C-modules, D-modules and R-modules of the XtremIO™ storage array. The one or more management modules 1008M of the distributed storage controller 1008 in such arrangements illustratively comprise a system-wide management module ("SYM module") of the XtremIO™ storage array, although other types and arrangements of system-wide management modules can be used in other embodiments. Accordingly, functionality for parity data computation in some embodiments is implemented under the control of at least one system-wide management module of the distributed storage controller 1008, utilizing the C-modules, D-modules and R-modules of the XtremIO™ storage array.

In the above-described XtremIO™ storage array example, each user data page has a fixed size such as 8 KB and its content-based signature is a 20-byte signature generated using an SHA1 hash function. Also, each page has a LUN identifier and an offset, and so is characterized by <lun_id, offset, signature>.

The content-based signature in the present example comprises a content-based digest of the corresponding data page. Such a content-based digest is more particularly referred to as a "hash digest" of the corresponding data page, as the content-based signature is illustratively generated by applying a hash function such as SHA1 to the content of that data page. The full hash digest of a given data page is given by the above-noted 20-byte signature. The hash digest may be represented by a corresponding "hash handle," which in some cases may comprise a particular portion of the hash digest. The hash handle illustratively maps on a one-to-one basis to the corresponding full hash digest within a designated cluster boundary or other specified storage resource boundary of a given storage system. In arrangements of this type, the hash handle provides a lightweight mechanism for uniquely identifying the corresponding full hash digest and its associated data page within the specified storage resource boundary. The hash digest and hash handle are both considered examples of "content-based signatures" as that term is broadly used herein.

Examples of techniques for generating and processing hash handles for respective hash digests of respective data pages are disclosed in U.S. Pat. No. 9,208,162, entitled "Generating a Short Hash Handle," and U.S. Pat. No. 9,286,003, entitled "Method and Apparatus for Creating a Short Hash Handle Highly Correlated with a Globally-Unique Hash Signature," both of which are incorporated by reference herein.

As mentioned previously, storage controller components in an XtremIO™ storage array illustratively include C-module, D-module and R-module components. For example, separate instances of such components can be associated with each of a plurality of storage nodes in a clustered storage system implementation.

The distributed storage controller in this example is configured to group consecutive pages into page groups, to arrange the page groups into slices, and to assign the slices to different ones of the C-modules. For example, if there are 1024 slices distributed evenly across the C-modules, and there are a total of 16 C-modules in a given implementation, each of the C-modules "owns" 1024/16=64 slices. In such arrangements, different ones of the slices are assigned to different ones of the control modules 1008C such that control of the slices within the storage controller 1008 of the storage system 1005 is substantially evenly distributed over the control modules 1008C of the storage controller 1008.

The D-module allows a user to locate a given user data page based on its signature. Each metadata page also has a size of 8 KB and includes multiple instances of the <lun_id, offset, signature> for respective ones of a plurality of the user data pages. Such metadata pages are illustratively generated by the C-module but are accessed using the D-module based on a metadata page signature.

The metadata page signature in this embodiment is a 20-byte signature but is not based on the content of the metadata page. Instead, the metadata page signature is generated based on an 8-byte metadata page identifier that is a function of the LUN identifier and offset information of that metadata page.

If a user wants to read a user data page having a particular LUN identifier and offset, the corresponding metadata page identifier is first determined, then the metadata page signature is computed for the identified metadata page, and then the metadata page is read using the computed signature. In this embodiment, the metadata page signature is more particularly computed using a signature generation algorithm that generates the signature to include a hash of the 8-byte metadata page identifier, one or more ASCII codes for particular predetermined characters, as well as possible additional fields. The last bit of the metadata page signature may always be set to a particular logic value so as to distinguish it from the user data page signature in which the last bit may always be set to the opposite logic value.

The metadata page signature is used to retrieve the metadata page via the D-module. This metadata page will include the <lun_id, offset, signature> for the user data page if the user page exists. The signature of the user data page is then used to retrieve that user data page, also via the D-module.

Write requests processed in the content addressable storage system 1005 each illustratively comprise one or more IO operations directing that at least one data item of the storage system 1005 be written to in a particular manner. A given write request is illustratively received in the storage system 1005 from a host device, illustratively one of the host devices 202. In some embodiments, a write request is received in the distributed storage controller 1008 of the storage system 1005 and directed from one processing module to another processing module of the distributed storage controller 1008. For example, a received write request may be directed from a routing module 1008R of the distributed storage controller 1008 to a particular control module 1008C of the distributed storage controller 1008. Other arrangements for receiving and processing write requests from one or more host devices can be used.

The term "write request" as used herein is intended to be broadly construed, so as to encompass one or more IO operations directing that at least one data item of a storage system be written to in a particular manner. A given write request is illustratively received in a storage system from a host device.

In the XtremIO™ context, the C-modules, D-modules and R-modules of the storage nodes 815 communicate with one another over a high-speed internal network such as an InfiniBand network. The C-modules, D-modules and R-modules coordinate with one another to accomplish various IO processing tasks.

The write requests from the host devices identify particular data pages to be written in the storage system 1005 by their corresponding logical addresses each comprising a LUN ID and an offset.

As noted above, a given one of the content-based signatures illustratively comprises a hash digest of the corresponding data page, with the hash digest being generated by applying a hash function to the content of that data page. The hash digest may be uniquely represented within a given storage resource boundary by a corresponding hash handle.

The storage system 1005 utilizes a two-level mapping process to map logical block addresses to physical block addresses. The first level of mapping uses an address-to-hash ("A2H") table and the second level of mapping uses a hash metadata ("HMD") table, with the A2H and HMD tables corresponding to respective logical and physical layers of the content-based signature mapping within the storage system 1005.

The first level of mapping using the A2H table associates logical addresses of respective data pages with respective content-based signatures of those data pages. This is also referred to logical layer mapping.

The second level of mapping using the HMD table associates respective ones of the content-based signatures with respective physical storage locations in one or more of the storage devices 1006. This is also referred to as physical layer mapping.

For a given write request, both of the corresponding HMD and A2H tables are updated in conjunction with the processing of that write request.

The A2H and HMD tables described above are examples of what are more generally referred to herein as "mapping tables" of respective first and second distinct types. Other types and arrangements of mapping tables or other content-based signature mapping information may be used in other embodiments.

The logical block addresses or LBAs of a logical layer of the storage system 1005 correspond to respective physical blocks of a physical layer of the storage system 805. The user data pages of the logical layer are organized by LBA and have reference via respective content-based signatures to particular physical blocks of the physical layer.

Each of the physical blocks has an associated reference count that is maintained within the storage system 1005. The reference count for a given physical block indicates the number of logical blocks that point to that same physical block.

In releasing logical address space in the storage system, a dereferencing operation is generally executed for each of the LBAs being released. More particularly, the reference count of the corresponding physical block is decremented. A reference count of zero indicates that there are no longer any logical blocks that reference the corresponding physical block, and so that physical block can be released.

It should also be understood that the particular arrangement of storage controller processing modules 1008C, 1008D, 1008R and 1008M as shown in the FIG. 10 embodiment is presented by way of example only. Numerous alternative arrangements of processing modules of a distributed storage controller may be used to implement functionality for determining compression block size and selecting prime numbers and associated numbers of sub-stripes for efficient packing of compressed data in a clustered storage system in other embodiments.

Additional examples of content addressable storage functionality implemented in some embodiments by control modules 1008C, data modules 1008D, routing modules 1008R and management module(s) 1008M of distributed storage controller 1008 can be found in U.S. Pat. No. 9,104,326, entitled "Scalable Block Data Storage Using Content Addressing," which is incorporated by reference herein. Alternative arrangements of these and other storage node processing modules of a distributed storage controller in a content addressable storage system can be used in other embodiments.

Illustrative embodiments of host devices or storage systems with functionality for parity data computation can provide a number of significant advantages relative to conventional arrangements. For example, some embodiments provide techniques for the efficient computation of parity data, thus reducing CPU and/or bandwidth overheads.

It is to be appreciated that the particular advantages described above and elsewhere herein are associated with particular illustrative embodiments and need not be present in other embodiments. Also, the particular types of information processing system features and functionality as illustrated in the drawings and described above are exemplary only, and numerous other arrangements may be used in other embodiments.

Illustrative embodiments of processing platforms utilized to implement host devices and storage systems with functionality for parity data computation will now be described in greater detail with reference to FIGS. 11 and 12. Although described in the context of system 100, these platforms may also be used to implement at least portions of other information processing systems in other embodiments.

Figure 11:
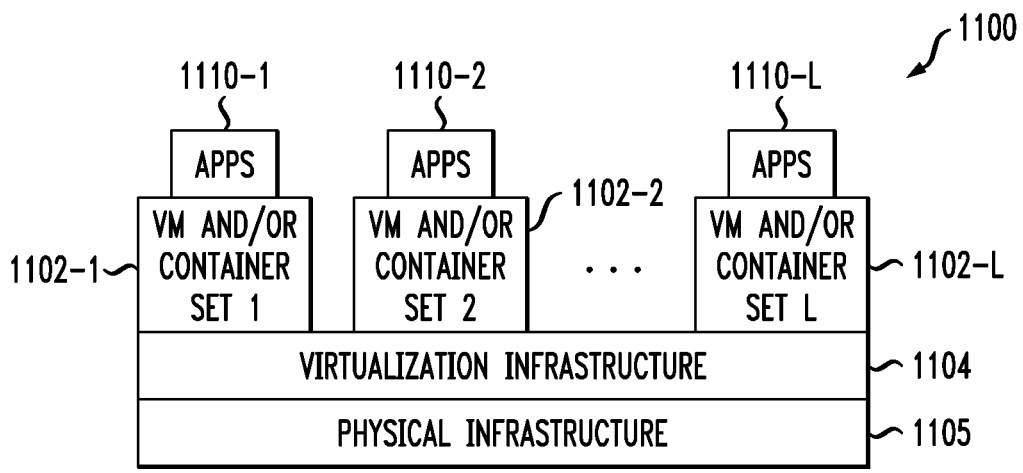
FIGS. 11 and 12 show examples of processing platforms that may be utilized to implement at least a portion of an information processing system in illustrative embodiments.
Figure 12:
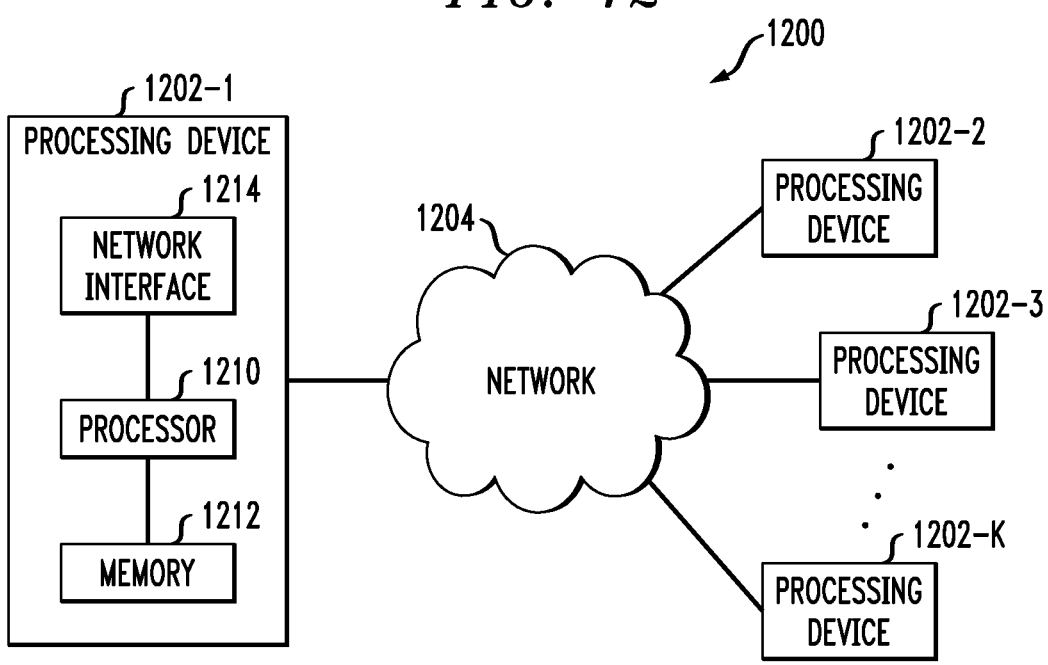

FIG. 11 shows an example processing platform comprising cloud infrastructure 1100. The cloud infrastructure 1100 comprises a combination of physical and virtual processing resources that may be utilized to implement at least a portion of the information processing system 100. The cloud infrastructure 1100 comprises multiple virtual machines (VMs) and/or container sets 1102-1, 1102-2, . . . 1102-L implemented using virtualization infrastructure 1104. The virtualization infrastructure 1104 runs on physical infrastructure 1105, and illustratively comprises one or more hypervisors and/or operating system level virtualization infrastructure. The operating system level virtualization infrastructure illustratively comprises kernel control groups of a Linux operating system or other type of operating system.

The cloud infrastructure 1100 further comprises sets of applications 1110-1, 1110-2, . . . 1110-L running on respective ones of the VMs/container sets 1102-1, 1102-2, . . . 1102-L under the control of the virtualization infrastructure 1104. The VMs/container sets 1102 may comprise respective VMs, respective sets of one or more containers, or respective sets of one or more containers running in VMs.

In some implementations of the FIG. 11 embodiment, the VMs/container sets 1102 comprise respective VMs implemented using virtualization infrastructure 1104 that comprises at least one hypervisor. Such implementations can provide functionality for parity data computation of the type described above for one or more processes running on a given one of the VMs. For example, each of the VMs can implement such functionality for one or more processes running on that particular VM.

An example of a hypervisor platform that may be used to implement a hypervisor within the virtualization infrastructure 1104 is the VMware® vSphere® which may have an associated virtual infrastructure management system such as the VMware® vCenter™. The underlying physical machines may comprise one or more distributed processing platforms that include one or more storage systems.

In other implementations of the FIG. 11 embodiment, the VMs/container sets 1102 comprise respective containers implemented using virtualization infrastructure 1104 that provides operating system level virtualization functionality, such as support for Docker containers running on bare metal hosts, or Docker containers running on VMs. The containers are illustratively implemented using respective kernel control groups of the operating system. Such implementations can provide functionality for parity data computation of the type described above for one or more processes running on different ones of the containers. For example, a container host device supporting multiple containers of one or more container sets can implement one or more instances of such functionality or logic.

As is apparent from the above, one or more of the processing modules or other components of system 100 may each run on a computer, server, storage device or other processing platform element. A given such element may be viewed as an example of what is more generally referred to herein as a "processing device." The cloud infrastructure 1100 shown in FIG. 11 may represent at least a portion of one processing platform. Another example of such a processing platform is processing platform 1200 shown in FIG. 12.

The processing platform 1200 in this embodiment comprises a portion of system 100 or 200 and includes a plurality of processing devices, denoted 1202-1, 1202-2, 1202-3, . . . 1202-K, which communicate with one another over a network 1204.

The network 1204 may comprise any type of network, including by way of example a global computer network such as the Internet, a WAN, a LAN, a satellite network, a telephone or cable network, a cellular network, a wireless network such as a WiFi or WiMAX network, or various portions or combinations of these and other types of networks.

The processing device 1202-1 in the processing platform 1200 comprises a processor 1210 coupled to a memory 1212.

The processor 1210 may comprise a microprocessor, a microcontroller, an application-specific integrated circuit (ASIC), a field-programmable gate array (FPGA) or other type of processing circuitry, as well as portions or combinations of such circuitry elements.

The memory 1212 may comprise random access memory (RAM), read-only memory (ROM), flash memory or other types of memory, in any combination. The memory 1212 and other memories disclosed herein should be viewed as illustrative examples of what are more generally referred to as "processor-readable storage media" storing executable program code of one or more software programs.

Articles of manufacture comprising such processor-readable storage media are considered illustrative embodiments. A given such article of manufacture may comprise, for example, a storage array, a storage disk or an integrated circuit containing RAM, ROM, flash memory or other electronic memory, or any of a wide variety of other types of computer program products. The term "article of manufacture" as used herein should be understood to exclude transitory, propagating signals. Numerous other types of computer program products comprising processor-readable storage media can be used.

Also included in the processing device 1202-1 is network interface circuitry 1214, which is used to interface the processing device with the network 1204 and other system components and may comprise conventional transceivers.

The other processing devices 1202 of the processing platform 1200 are assumed to be configured in a manner similar to that shown for processing device 1202-1 in the figure.

Again, the particular processing platform 1200 shown in the figure is presented by way of example only, and system 100 or 200 may include additional or alternative processing platforms, as well as numerous distinct processing platforms in any combination, with each such platform comprising one or more computers, servers, storage devices or other processing devices.

For example, other processing platforms used to implement illustrative embodiments can comprise converged infrastructure such as VxRail™, VxRack™, VxRack™ FLEX, VxBlock™ or Vblock® converged infrastructure from VCE, the Virtual Computing Environment Company, now the Converged Platform and Solutions Division of Dell EMC.

It should therefore be understood that in other embodiments different arrangements of additional or alternative elements may be used. At least a subset of these elements may be collectively implemented on a common processing platform, or each such element may be implemented on a separate processing platform.

As indicated previously, components of an information processing system as disclosed herein can be implemented at least in part in the form of one or more software programs stored in memory and executed by a processor of a processing device. For example, at least portions of the functionality for determining compression block size and selecting prime numbers and associated numbers of sub-stripes for efficient packing of compressed data as disclosed herein are illustratively implemented in the form of software running on one or more processing devices.

It should again be emphasized that the above-described embodiments are presented for purposes of illustration only. Many variations and other alternative embodiments may be used. For example, the disclosed techniques are applicable to a wide variety of other types of information processing systems, host devices, storage systems, storage nodes, storage devices, storage controllers, RAID arrays or other data striping, etc. Also, the particular configurations of system and device elements and associated processing operations illustratively shown in the drawings can be varied in other embodiments. Moreover, the various assumptions made above in the course of describing the illustrative embodiments should also be viewed as exemplary rather than as requirements or limitations of the disclosure. Numerous other alternative embodiments within the scope of the appended claims will be readily apparent to those skilled in the art.

What is claimed is:

1. An apparatus comprising:
   in an information processing system implementing data striping, wherein the information processing system comprises a set of data storage devices for storing data blocks arranged in respective columns on each data storage device and rows across the set of data storage devices to form at least one data stripe; and a set of parity storage devices for storing parity blocks computed via one or more parity operations based on the data blocks of the at least one data stripe;
   at least one of the data storage devices comprising a processing device configured to:
      receive an instruction from the information processing system to perform at least a portion of a parity operation;

perform the portion of the parity operation in response to the instruction; and send a result of the performed portion of the parity operation to the information processing system, wherein the result is useable by the information processing system for performing another portion of the parity operation.

2. The apparatus of claim 1, wherein the portion of the parity operation performed by the processing device of the at least one data storage device comprises performing a column parity operation.

3. The apparatus of claim 2, wherein the column parity operation comprises performing an XOR operation on at least a portion of the column of data blocks stored in the at least one data storage device to generate column parity data.

4. The apparatus of claim 3, wherein the column parity data is the result sent to the information processing system.

5. The apparatus of claim 4, wherein the column parity data is combinable with other forms of parity data storable on at least one of the set of parity storage devices.

6. The apparatus of claim 5, wherein the column parity data is combinable with diagonal parity data computed for the at least one data stripe.

7. The apparatus of claim 1, wherein the set of data storage devices and the set of parity storage devices are part of a Redundant Array of Independent Disks (RAID) storage system.

8. The apparatus of claim 7, wherein the number of data storge devices in the RAID storage system comprises a prime number k, and wherein a column of the RAID storage system comprises k−1 blocks.

9. The apparatus of claim 7, wherein the RAID storage system implements RAID 6 with the number of data storage devices being k and the number of parity storage devices being n, where n is greater than one.

10. The apparatus of claim 1, wherein the set of data storage devices and the set of parity storage devices comprise solid state drives (SSDs).

11. The apparatus of claim 10, wherein the processing device associated with the at least one data storage device comprising one or more of a central processing unit and a hardware accelerator internal to the SSD.

12. A method comprising:
in an information processing system implementing data striping, wherein the information processing system comprises a set of data storage devices for storing data blocks arranged in respective columns on each data storage device and rows across the set of data storage devices to form at least one data stripe; and a set of parity storage devices for storing parity blocks computed via one or more parity operations based on the data blocks of the at least one data stripe;
receiving by at least one of the data storage devices comprising a processing device configured to an instruction from the information processing system to perform at least a portion of a parity operation;
performing by the processing device of the at least one data storage device the portion of the parity operation in response to the instruction; and
sending a result of the performed portion of the parity operation from the at least one data storage device to the information processing system, wherein the result is useable by the information processing system for performing another portion of the parity operation.

13. The method of claim 12, wherein the portion of the parity operation performed by the processing device of the at least one data storage device comprises performing a column parity operation.

14. The method of claim 13, wherein the column parity operation comprises performing an XOR operation on at least a portion of the column of data blocks stored in the at least one data storage device to generate column parity data.

15. The method of claim 14, wherein the column parity data is the result sent to the information processing system.

16. The method of claim 15, wherein the column parity data is combinable with other forms of parity data storable on at least one of the set of parity storage devices.

17. The method of claim 16, wherein the column parity data is combinable with diagonal parity data computed for the at least one data stripe.

18. The method of claim 12, wherein the set of data storage devices and the set of parity storage devices are part of a Redundant Array of Independent Disks (RAID) storage system.

19. The method of claim 11, wherein the processing device associated with the at least one data storage device comprises one or more of a central processing unit and a hardware accelerator internal to the SSD.

20. A computer program product comprising a non-transitory processor-readable storage medium having stored therein program code of one or more software programs wherein:
in an information processing system implementing data striping, wherein the information processing system comprises a set of data storage devices for storing data blocks arranged in respective columns on each data storage device and rows across the set of data storage devices to form at least one data stripe; and a set of parity storage devices for storing parity blocks computed via one or more parity operations based on the data blocks of the at least one data stripe, the program code when executed by a processing device associated with at least one of the data storage devices causes said at least one data storage device to:
receive an instruction from the information processing system to perform at least a portion of a parity operation;
perform the portion of the parity operation in response to the instruction; and
send a result of the performed portion of the parity operation to the information processing system, wherein the result is useable by the information processing system for performing another portion of the parity operation.

* * * * *